(12) United States Patent
Greeff

(10) Patent No.: US 7,436,267 B2
(45) Date of Patent: *Oct. 14, 2008

(54) MICROSTRIP LINE DIELECTRIC OVERLAY

(75) Inventor: Roy Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/458,976

(22) Filed: Jul. 20, 2006

(65) Prior Publication Data

US 2006/0290438 A1 Dec. 28, 2006

Related U.S. Application Data

(62) Division of application No. 10/789,931, filed on Feb. 27, 2004.

(51) Int. Cl.
*H01P 3/08* (2006.01)

(52) U.S. Cl. .......................................... 333/1; 333/238

(58) Field of Classification Search ............ 333/1, 333/238

See application file for complete search history.

(56) References Cited

U.S. PATENT DOCUMENTS

| | | | |
|---|---|---|---|
| 4,118,670 A | 10/1978 | Dickens | |
| 4,131,858 A | 12/1978 | Niehenke et al. | |
| 4,441,088 A | 4/1984 | Anderon | |
| 4,816,789 A | 3/1989 | Mars | |
| 4,951,123 A | 8/1990 | Lee et al. | |
| 5,043,792 A | 8/1991 | Adachi | |
| 5,073,761 A | 12/1991 | Waterman et al. | |
| 5,210,509 A | 5/1993 | Greeff et al. | |
| 5,485,484 A | 1/1996 | Williams et al. | |
| 5,568,521 A | 10/1996 | Williams et al. | |
| 5,696,795 A | 12/1997 | Williams et al. | |
| 5,719,908 A | 2/1998 | Greeff et al. | |
| 5,801,669 A | 9/1998 | Hall | |
| 5,949,392 A | 9/1999 | Hall | |
| 5,982,249 A | 11/1999 | Bruns | |
| 6,075,973 A | 6/2000 | Greeff et al. | |

(Continued)

FOREIGN PATENT DOCUMENTS

DE 0131327 6/1978

(Continued)

OTHER PUBLICATIONS

"Notice of Allowance mailed Aug. 9, 2007in U.S. Appl. No. 10/789,931", 4 pages.

(Continued)

*Primary Examiner*—Benny Lee
(74) *Attorney, Agent, or Firm*—Schwegman, Lundberg & Woessner, P.A.

(57) ABSTRACT

A printed circuit board has a dielectric constant different from the dielectric constant of free space, with at least two microstrip lines routed adjacent to one another on a surface of the printed circuit board. A dielectric coating is applied to at least one of the at least two microstrip lines such that the dielectric constant of the dielectric coating differs from the dielectric constant of free space. In a further embodiment, the dielectric coating comprises a material having a dielectric constant approximately equal to the dielectric constant of the printed circuit board.

10 Claims, 3 Drawing Sheets

U.S. PATENT DOCUMENTS

| | | |
|---|---|---|
| 6,154,104 A | 11/2000 | Hall |
| 6,169,474 B1 | 1/2001 | Greeff et al. |
| 6,192,222 B1 | 2/2001 | Greeff et al. |
| 6,229,987 B1 | 5/2001 | Greeff et al. |
| 6,255,993 B1 | 7/2001 | Greeff et al. |
| 6,324,211 B1 | 11/2001 | Ovard et al. |
| 6,356,106 B1 | 3/2002 | Greeff et al. |
| 6,356,764 B1 | 3/2002 | Ovard et al. |
| 6,373,740 B1 | 4/2002 | Forbes et al. |
| 6,459,726 B1 | 10/2002 | Ovard et al. |
| 6,600,905 B2 | 7/2003 | Greeff et al. |
| 6,603,391 B1 | 8/2003 | Greeff et al. |
| 6,745,268 B1 | 6/2004 | Greeff et al. |
| 6,871,253 B2 | 3/2005 | Greeff et al. |
| 6,882,082 B2 | 4/2005 | Greeff et al. |
| 6,934,785 B2 | 8/2005 | Lee et al. |
| 2001/0001758 A1 | 5/2001 | Greeff et al. |
| 2002/0015436 A1 | 2/2002 | Ovard et al. |
| 2002/0083255 A1 | 6/2002 | Greeff et al. |
| 2002/0090958 A1 | 7/2002 | Ovard et al. |
| 2004/0027240 A1 | 2/2004 | Greeff et al. |
| 2004/0170074 A1 | 9/2004 | Greeff et al. |
| 2004/0225770 A1 | 11/2004 | Lee et al. |
| 2004/0225777 A1 | 11/2004 | Greeff et al. |
| 2004/0251929 A1 | 12/2004 | Pax et al. |
| 2005/0030797 A1 | 2/2005 | Pax et al. |
| 2005/0166110 A1 | 7/2005 | Swanson et al. |
| 2005/0190587 A1 | 9/2005 | Greeff |

FOREIGN PATENT DOCUMENTS

| | | | |
|---|---|---|---|
| EP | 0382558 A1 | 8/1990 | |

OTHER PUBLICATIONS

US 6,937,057, 08/2005, Pax et al. (withdrawn)

MICROSTRIP LINE DIELECTRIC OVERLAY

RELATED APPLICATIONS

This application is a Divisional of U.S. Ser. No. 10/789,931, filed Feb. 27, 2004, which is incorporated herein by reference.

FIELD OF THE INVENTION

The invention relates generally to printed circuit boards, and more specifically to dielectric overlay on microstrip printed circuit strips.

BACKGROUND OF THE INVENTION

Electronic devices typically include circuits assembled from components that are soldered to conductive traces on a printed circuit board. The board itself is formed of a material such as fiberglass, and has conductive copper traces running along at least one plane of the circuit board. Sophisticated circuit boards often have several layers of traces, including layers on the top and bottom side of the circuit board and embedded within the circuit board. These various traces connect components to one another, and distribute signals such as power, ground, and clock signals throughout the circuit board.

Electrical signals pass through the conductive copper traces between components at high speeds or high frequencies in modem devices, making transmission line effects important to understanding how the signals travel. At high frequencies, the dielectric constant (also known as the relative permittivity) of the material surrounding the conductors affects the speed of propagation of a signal within the conductors. This constant describes the way in which an electric field penetrates a specific material relative to free space. It is also important for understanding how fast a signal travels in a conductor, as propagation delay of a signal in a conductor is proportional to the square root of the dielectric constant. Because the propagation delay of a signal traveling through a conductor in air is approximately 85 picoseconds per inch, we can determine the propagation delay of a signal traveling in the same conductor surrounded by another medium by multiplying 85 picoseconds per inch by the square root of the dielectric constant of the new medium.

The dielectric constant of fiberglass printed circuit boards, such as the common FR4-type circuit board, is approximately 4.5, meaning that a signal propagating on a conductive circuit trace entirely within the FR4 material known as a stripline experiences a delay of the square root of 4.5 multiplied by 85 picoseconds per inch, or approximately 180 picoseconds per inch. Circuit traces on the top and bottom surfaces of the FR4 circuit board are known as microstrips, and because they are surrounded by a combination of free space and FR4 material, experience an effective dielectric constant of about 2.8, resulting in a propagation delay of approximately 140 picoseconds per inch.

A circuit designer can account for these differences in laying out conductive traces on and within a printed circuit board, ensuring that signals take a desired or known time to travel between components. The situation is complicated, however, when various outside forces cause the electric fields surrounding a conductor to vary in configuration, resulting in a changing effective dielectric constant around a microstrip line as a circuit operates.

One example of such a circumstance can occur when two microstrip lines run parallel and near to one another on a surface of a circuit board above a ground plane within the circuit board. When the conductors are carrying signals near one another in voltage or potential (known as even mode), the electric field surrounding each conductor is spatially different in than when the two conductors are carrying signals of different voltages (known as odd mode). When the conductors are at differing potentials, a greater portion of the electric field resides in free space, resulting in a reduction in propagation delay. The change in propagation delay with changed signal mode also results in a significant increase in crosstalk between conductors as observed at the receiving or far end of the conductors, which is also undesirable.

It is therefore desired to reduce the change in propagation delay between even and odd mode signals in microstrip lines.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention in some embodiments reduces the change in propagation delay between even and odd mode signals in microstrip lines. In one specific embodiment of the invention, two microstrip lines are routed on the same surface of a printed circuit board near enough one another that their electric fields influence one another when the microstrip lines carry electric signals. A dielectric coating is applied to at least a first one of the two microstrip lines, where the dielectric coating has a dielectric constant greater than one, or greater than the dielectric constant of free space. The applied dielectric coating reduces the change in dielectric constant seen by the first microstrip line when the signals in the microstrip lines change, reducing the change in propagation delay experienced by the first microstrip line. The net effect is that far-end observed crosstalk between the lines is substantially reduced, as is observed jitter, due to the in-phase nature of the signals propagating down adjacent lines.

Figure 1:
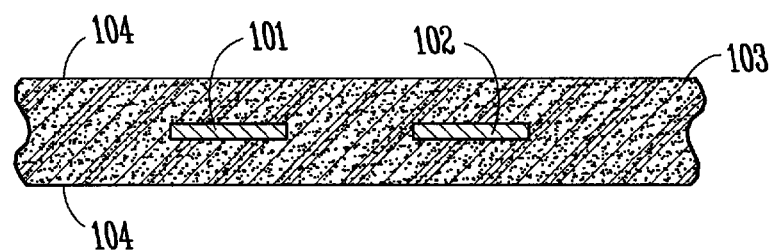
FIG. 1 illustrates a cutaway view of a pair of stripline conductors within a printed circuit board, consistent with the prior art.

FIG. 1 shows a typical pair of striplines, consistent with the prior art. The striplines 101 and 102 are routed through the circuit board material 103, which in some embodiments is an FR-4 fiberglass circuit board having a dielectric constant of approximately 4.2-4.5. The conductive traces 101 and 102 are seen here from an end view, and will typically run a fraction of an inch to many inches to connect one electrical component to another. The composition of conductive traces 101 and 102 is typically copper, but can in other embodiments be any other suitable conductor, such as aluminum, silver, or another metal.

When the stripline conductor 101 is carrying a signal that is different in electric potential from a signal carried in stripline conductor 102, the electric field of conductor 102 will influence the electric field of conductor 101. The change in spatial configuration of the electric field will have relatively little effect on the effective dielectric constant of surrounding material as seen by the stripline 101, however, as the electric field will remain within the FR4 circuit board material 103.

Figure 2:
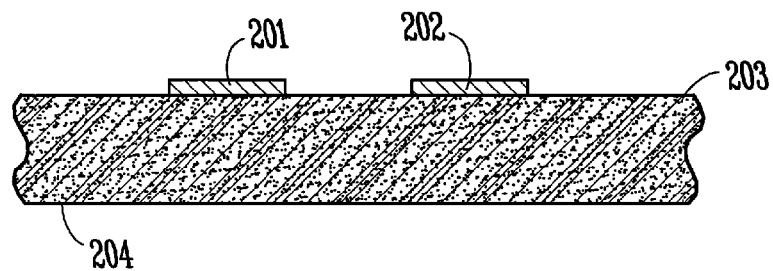
FIG. 2 shows a cutaway view of a pair of microstrip line conductors on a printed circuit board, consistent with the prior art.

Circumstances are different in the case of a pair of microstrip line conductors as shown in FIG. 2, consistent with the prior art. Here, the microstrip line conductors 201 and 202 are similarly routed adjacent to one another, but are routed on the surface of the printed circuit board 203. The circuit board has the same dielectric constant of approximately 4.2-4.5, but the electric field surrounding conductor 201 is partly in free space, which has a dielectric constant of 1.0, and partly in the circuit board 203. This results in an effective dielectric constant as seen by the microstrip line 201 of some value between that of free space and the dielectric constant of the circuit board.

The dielectric constant of material surrounding a conductor is important to propagation of a signal in that the speed the signal travels is inversely proportional to the square root of the effective dielectric constant seen by the conductor's electric field. The propagation velocity of a signal in the microstrip line of FIG. 2 is therefore faster than the propagation of the same signal in the stripline of FIG. 1, because the dielectric constant of the fiberglass board in FIG. 1 that contains nearly all the electric field is larger than the effective dielectric constant seen by the microstrip lines of FIG. 2, which have a lower effective dielectric constant due to the portion of the electric field that travels in free space. Alternatively, some engineers refer to the propagation velocity of the signal in terms of propagation delay, as is explained in greater detail in the background.

When neighboring striplines as in FIG. 1 carry signals that vary in voltage with respect to one another, the electric field around each of the striplines changes in spatial configuration. But, whatever the changes in voltage within the respective lines, the electric field typically remains almost nearly entirely within the fiberglass circuit board 103, which has a dielectric constant of approximately 4.5. This is partly due to the configuration of FR4 fiberglass on all sides, and partly due to the fiberglass's filling essentially all space between the striplines 101 and 102 and the ground planes 104. The situation is more complex in the case of the microstrip lines of FIG. 2, in which FR4 fiberglass separates the microstrip lines from ground plane 204 on one side, but which are bounded by free space on the other side. As the voltage difference between microstrip lines 201 and 202 change with respect to one another, the electric fields surrounding each microstrip line will also change in spatial configuration, moving a greater or lesser portion of the electric field surrounding each line into the fiberglass 203 from the free space.

Figure 3:
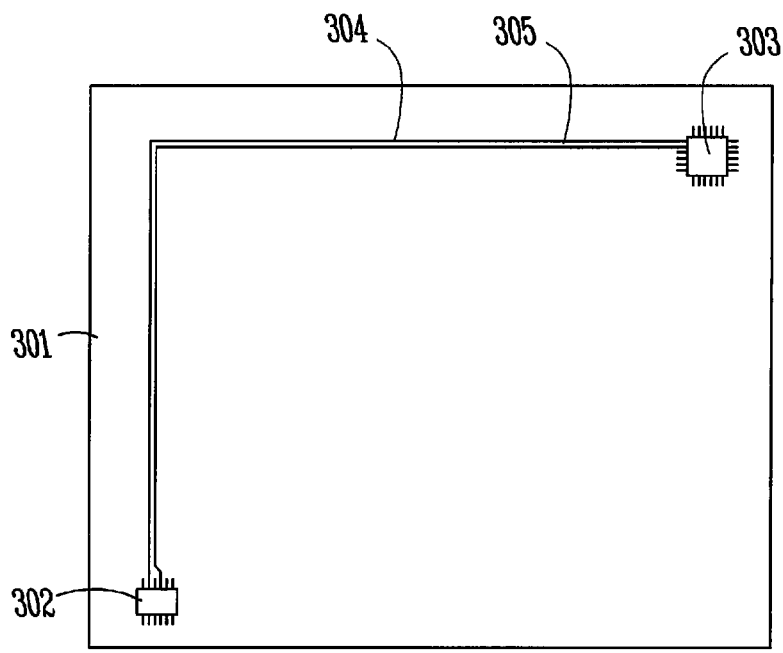
FIG. 3 shows a pair of adjacent microstrip lines mounted on a printed circuit board connecting a signal generating integrated circuit to a signal receiving integrated circuit, consistent with an embodiment of the present invention.

This change in spatial configuration of the electric field surrounding microstrip lines such as 201 and 202 results in a change in effective dielectric constant seen by a signal propagating on the lines, and therefore results in a change in propagation velocity or propagation delay. Consider the printed circuit board shown at 301 of FIG. 3. A first integrated circuit 302 generates two signals sent to integrated circuit 303 via microstrip lines 304 and 305.

Also, because the lines are routed close to one another, the electric fields between the lines create capacitive coupling between lines, in addition to other coupling effects such as inductive coupling between the lines. This results in a small portion of the signal in microstrip line 304 being coupled into microstrip line 305, and a small portion of the signal in microstrip line 305 being coupled into microstrip line 304. This coupling can result in observed far-end crosstalk between the lines, where a portion of the signal sent on microstrip line 304 is observed on microstrip line 305, and a portion of the signal sent on microstrip line 305 can be observed on microstrip line 304 at the receiving integrated circuit 303.

This effect becomes more problematic where state transitions in a digital signal being sent along microstrips 304 and 305 do not occur at the same time at the receiving end, such as due to changes in signal velocity or propagation delay in the microstrip lines. This makes stabilization of the propagation velocity of the signals, and therefore stabilization of the effective dielectric constant seen by the microstrip lines in the context of a changing electric field, important to reducing observed far-end crosstalk and jitter.

Figure 4:
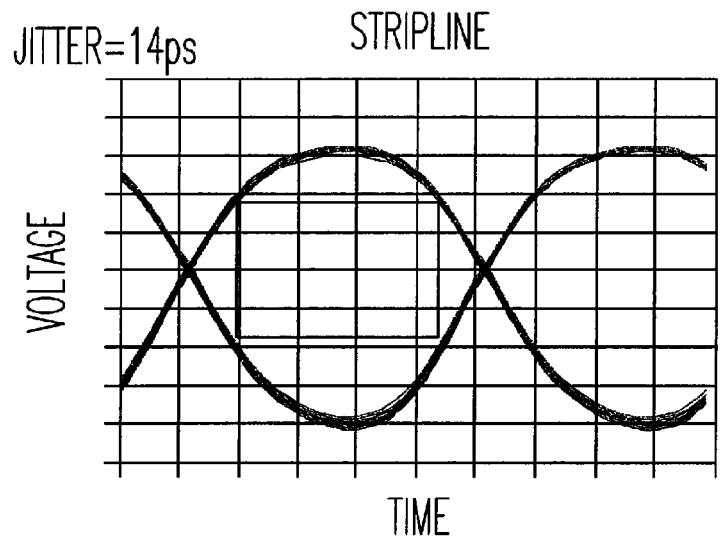
FIG. 4 shows an eye pattern illustrating jitter in a stripline, consistent with the prior art.
Figure 5:
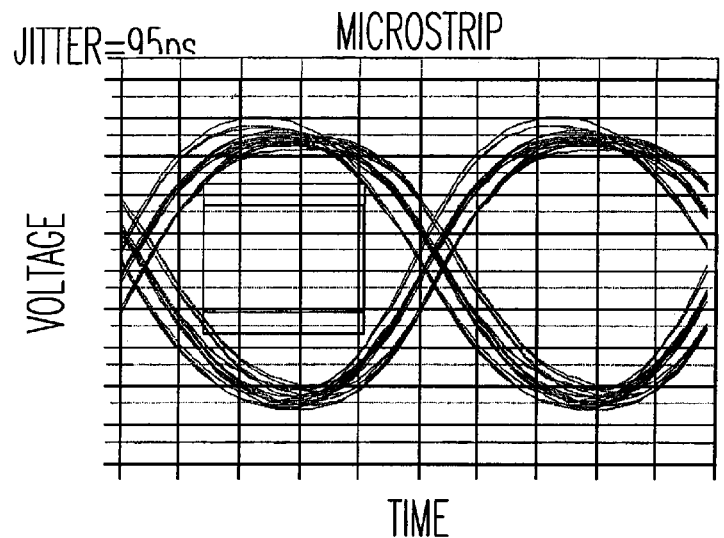
FIG. 5 shows an eye pattern illustrating jitter in a microstrip line, consistent with the prior art.

The eye charts of FIGS. 4 and 5 illustrate the difference in jitter that can be observed in a typical case between similar microstrip and striplines, as a result of differences in potential between two adjacent lines. FIG. 4 shows that for striplines such as in FIG. 1, a jitter of 14 picoseconds is observed, and all observed signal transitions are grouped relatively tightly together in time. In contrast, the microstrip line eye chart of FIG. 5 shows an average jitter figure of 95 picoseconds, and shows three distinct timing groupings for signals transitioning from low to high, and three distinct timing groupings for signals traveling from high to low.

These three groupings represent the cases in which the measured microstrip line is transitioning to lower potential than the adjacent line, where the measured microstrip line is transitioning to the same potential as the adjacent line, and where the measured microstrip line is transitioning to a higher potential than the adjacent microstrip line. Because the electric field around the microstrip line being measured is configured differently for each of the three cases, the effective dielectric constant it observes, and the resulting propagation delay of a signal along the microstrip line, changes for each case.

Figure 6:
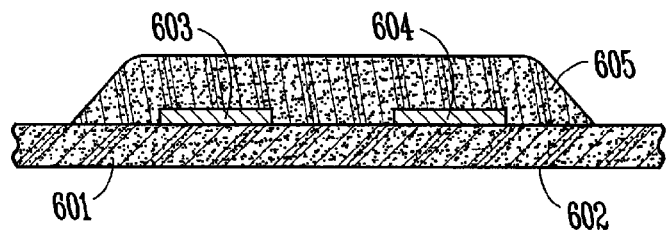
FIG. 6 illustrates a pair of adjacent microstrip lines with a dielectric coating, consistent with the present invention.

The present invention seeks to reduce the far-end observed effects such as crosstalk and jitter by adding a dielectric coating to the top side of such microstrip lines, as is shown in FIG. 6. Here, a 5 mil FR4 fiberglass material having a dielectric constant of approximately 4.2 separates a ground plane 602 from adjacent microstrip lines 603 and 604. A dielectric coating 605 is applied in a thickness of 8.2 mils, which is calculated to produce a stable effective dielectric constant observed by the microstrip lines, and make the propagation velocities of signals in the microstrip lines substantially the same under varying signal conditions.

Various embodiments of the invention will have various thicknesses of dielectric overcoat, which in some embodiments will be dependent on the spacing between the microstrip line and the ground plane, between the microstrip line and an adjacent microstrip line, or some combination thereof. For example, a dielectric coat may be applied at 0.5, 0.75, 1, 1.25, 1.5, or some other multiple thickness relative to the distance between the microstrip line and the ground plane. In further embodiments, these specified thicknesses will be minimum thicknesses rather than target thicknesses.

The overcoat material 605 is desirably of the same or relatively similar dielectric constant as the substrate 601, to minimize the change in effective dielectric constant and in resulting propagation delay when the electric field around a microstrip line changes in spatial configuration. By using a dielectric overcoat material having the same dielectric constant, such changes in effective dielectric constant and propagation delay can be nearly eliminated. The thickness of the dielectric overcoat material will be a compromise between being thick enough to contain most all of the electric field surrounding microstrip lines 603 and 604, and being thin enough to be physically practical and cost-effective. It should be noted, however, that any dielectric overcoat material having a dielectric constant greater than that of free space within reason at even a modest thickness will result in some improvement in far-end observed crosstalk and jitter.

Figure 7:
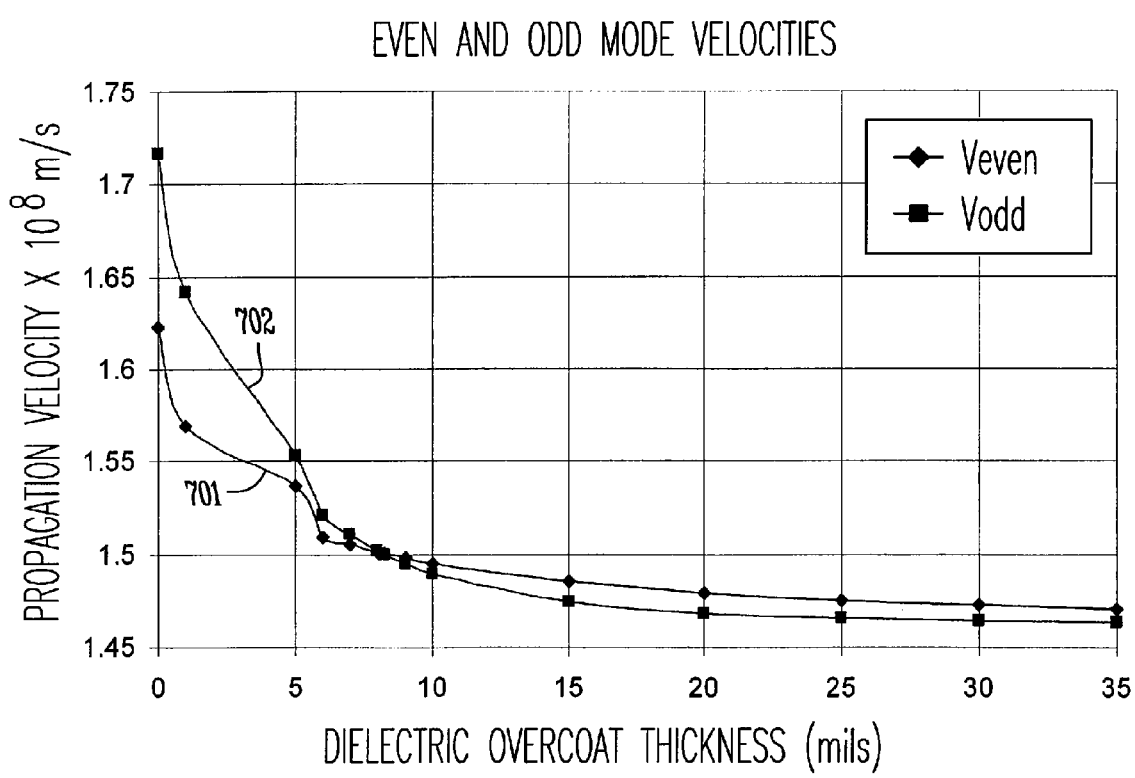
FIG. 7 illustrates the difference in even-mode and odd-mode velocities with various dielectric overcoat thicknesses, consistent with an embodiment of the present invention.

FIG. 7 illustrates the difference in even-mode velocities ($V_{even}$) and odd-mode velocities ($V_{odd}$) with various dielectric overcoat thicknesses, consistent with an embodiment of the present invention. The resulting even and odd mode propagation velocities shown here will change with geometry and materials used in constructing the microstrip lines, but serves to illustrate the effectiveness of an 8.2 mil dielectric overcoat over microstrip lines on a 5 mil FR4 board, where the dielectric constant of the overcoat and the FR4 board are both approximately 4.2, such as was shown and discussed in conjunction with FIG. 6.

Trace 701 shows how the propagation velocity changes for even mode signals in the microstrip lines of FIG. 6 as the thickness of the dielectric overcoat is changed, while trace 702 shows how odd mode propagation velocities vary as the dielectric overcoat thickness changes. With no dielectric overcoat, the propagation velocity of odd mode signals is significantly higher than the propagation velocity shown for even mode signals. The difference in propagation velocities between the odd mode and even mode signals is significantly lower at a 5 mil overcoat thickness, and reaches zero at approximately 8.2 mils. This indicates that even mode and odd mode propagation velocities for this specific configuration are the same when the dielectric overcoat is applied in a thickness of 8.2 mils. It should be noted, however, that exceeding this thickness results in a measurable divergence of propagation velocities through 15 or 20 mils overcoat thickness, with propagation velocities again converging as the overcoat thickness approaches infinity. While exceeding the overcoat thickness of 8.2 mils is therefore undesirable in the present case, results of thicker overcoats are still significantly better than with no overcoat or a very thin overcoat, and will be suitable for some embodiments of the invention.

Although the example embodiments described here discuss specific materials illustrated in example drawings, the invention is not so limited. Different substrates, for example, may be used, and will optimally use dielectric coatings having different dielectric constants to minimize changes in propagation delay. Teflon (Trademark of DuPont), also known as PTFE or polytetrafluoroethylene, is used to make circuit boards for many high-performance applications, and has a relatively low dielectric constant of about 2.0. This material is sometimes used because its low dielectric constant results in a relatively low propagation delay for stripline and microstrip lines, resulting in a relatively high performance circuit board. Because additional cost of the PTFE material is expended to achieve high performance in critical applications, it is anticipated that a dielectric overlay material applied to microstrip lines routed on PTFE substrates will be of substantial benefit to a PTFE circuit board designer.

Because PTFE has a dielectric constant of approximately 2.0, the dielectric overlay material will ideally have a dielectric constant near 2.0. The end result will be a microstrip line in which the signals travel (sqrt(2.0)/sqrt(4.2)), or approximately 1.45 times as fast as the same signal would travel on the same microstrip line on an FR4 board having a dielectric constant of 4.2.

It is also well-known in the field of high-frequency circuit design that the impedance of a transmission line such as a stripline or microstrip line must match the impedance of the load device, such as the receiving integrated circuit 303, to avoid reflecting a received signal back on the transmission line from the load device. Matching impedances further improves signal power received at the load device, and is usually a goal of designers of high-performance transmission lines. It bears relevance to the present invention in that the characteristic impedance of the dielectric coated microstrip lines of the present invention, such as lines 603 and 604 of FIG. 6, should be considered in designing the microstrip line and the surrounding configuration. The width of the microstrip line relative to the distance between the microstrip line and the ground plane is perhaps the primary consideration, but because the effective dielectric constant seen by the microstrip line plays a role in calculating characteristic impedance, factors affecting the dielectric constant, such as the dielectric overlay of the present invention, should also be taken into account.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

I claim:

1. A method of reducing propagation delay variation in a microstrip line, comprising:
   applying a dielectric coating to at least a first microstrip line routed near a second microstrip line, wherein the first microstrip line is separated from a ground plane by a substrate and such that the dielectric coating is applied to the at least a first microstrip line in a thickness equal to at least half the thickness of the substrate separating the at least a first microstrip line from the ground plane;
   wherein the dielectric coating comprises a coating material applied over the at least a first microstrip line in a thickness greater than a thickness of the coating material in at least one area of the substrate having the coating material applied thereto.

2. The method of claim 1, wherein the dielectric coating is applied by increasing the thickness of the coating material applied to the substrate of the microstrip line over the at least a first microstrip line relative to an average thickness of the conformal coating across the substrate.

3. The method of claim 1, wherein the dielectric coating is applied over the at least a first microstrip line in a thickness such that propagation delay variation is approximately minimized.

4. The method of claim 1, wherein the dielectric constant of the dielectric coating is greater than one.

5. The method of claim 1, wherein the dielectric constant of the dielectric coating is approximately equal to the dielectric constant of the substrate comprising a part of the microstrip line.

6. A method of reducing far-end crosstalk in a microstrip line assembly, comprising:

coating at least a first of a first and second microstrip line with a dielectric coating, the first and second microstrip lines physically located such that the electric field from the second microstrip line influences the electric field from the first microstrip line when the first and second microstrip lines are carrying electric signals, the first microstrip line separated from a ground plane by a substrate, wherein the dielectric coating has a dielectric constant greater than one, and wherein the dielectric coating reduces the far-end crosstalk between the first and second microstrip lines, and further such that the dielectric coating comprises a coating material applied over the first microstrip line in a thickness greater than a thickness of the coating material in at least one area of the substrate having the coating material applied thereto.

7. The method of claim 6, wherein the dielectric coating comprises a material having a dielectric constant approximately equal to the dielectric constant of a substrate material of the microstrip lines.

8. The method of claim 6, wherein the dielectric coating is applied in a thickness that approximately minimizes far-end crosstalk between the first and the second microstrip lines.

9. The method of claim 6, wherein the microstrip line assembly comprises at least the first and second microstrip lines on the same surface of a printed circuit board.

10. The method of claim 6, wherein the substrate comprises a printed circuit board, and wherein the dielectric coating comprises increasing the thickness of the printed circuit board conformal coating over the first microstrip line relative to an average thickness of the conformal coating applied across the printed circuit board.

* * * * *